United States Patent
Kodama

(10) Patent No.: US 9,065,557 B2
(45) Date of Patent: Jun. 23, 2015

(54) SIGNAL TRANSMISSION DEVICE AND SIGNAL TRANSMISSION METHOD

(71) Applicant: Funai Electric Co., Ltd., Osaka (JP)

(72) Inventor: Shinichi Kodama, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 14/322,391

(22) Filed: Jul. 2, 2014

(65) Prior Publication Data

US 2015/0023446 A1  Jan. 22, 2015

(30) Foreign Application Priority Data

Jul. 18, 2013  (JP) ................................. 2013-149384

(51) Int. Cl.

| | |
|---|---|
| *H04L 27/02* | (2006.01) |
| *H04B 15/00* | (2006.01) |
| *H04L 27/34* | (2006.01) |
| *H01P 3/08* | (2006.01) |
| *H04B 3/04* | (2006.01) |
| *H04L 25/08* | (2006.01) |
| *H01P 3/02* | (2006.01) |
| *H05K 1/02* | (2006.01) |

(52) U.S. Cl.
CPC ................ *H04B 15/00* (2013.01); *H04L 27/34* (2013.01); *H01P 3/08* (2013.01); *H04B 3/04* (2013.01); *H04L 25/085* (2013.01); *H05K 1/0218* (2013.01); *H05K 1/024* (2013.01); *H05K 1/0245* (2013.01); *H01P 3/026* (2013.01)

(58) Field of Classification Search
CPC ............ H04B 3/02; H04B 3/20–3/238; H04B 1/10–1/14; H04B 1/1027–1/26; H04B 14/02–14/068; H04L 25/08; H03K 7/00; H03M 5/02–5/20
See application file for complete search history.

(56) References Cited

U.S. PATENT DOCUMENTS

| 7,113,760 B1* | 9/2006 | Petrov et al. ................... 455/324 |
| 2007/0047969 A1* | 3/2007 | Nakashima et al. .......... 398/198 |
| 2007/0076820 A1* | 4/2007 | Kao et al. ....................... 375/322 |
| 2009/0086452 A1 | 4/2009 | Liu et al. |
| 2009/0107710 A1 | 4/2009 | Goergen |
| 2010/0237961 A1 | 9/2010 | Pai et al. |

FOREIGN PATENT DOCUMENTS

| GB | 2432468 A | 5/2007 |
| JP | 2002-289992 A | 10/2002 |

OTHER PUBLICATIONS

Extended European Search Report in corresponding European Application No. 14175295.6 dated Mar. 30, 2015 (6 pages).

* cited by examiner

*Primary Examiner* — Dac Ha
(74) *Attorney, Agent, or Firm* — Osha Liang LLP

(57) ABSTRACT

A signal transmission device includes a signal sender that sends first and second transmission signals of mutually opposite phases, a first transmission path over which the first transmission signal is transmitted, a second transmission path over which the second transmission signal is transmitted, and a signal receiver that converts the first transmission signal received from the first transmission path and the second transmission signal received from the second transmission path into an output signal of a single phase. The signal transmission device differentiates each amplitude of the first and second transmission signals sent from the signal sender, and the signal receiver, based on an amplitude ratio of the first and second transmission signals, converts the received first and second transmission signals.

20 Claims, 11 Drawing Sheets

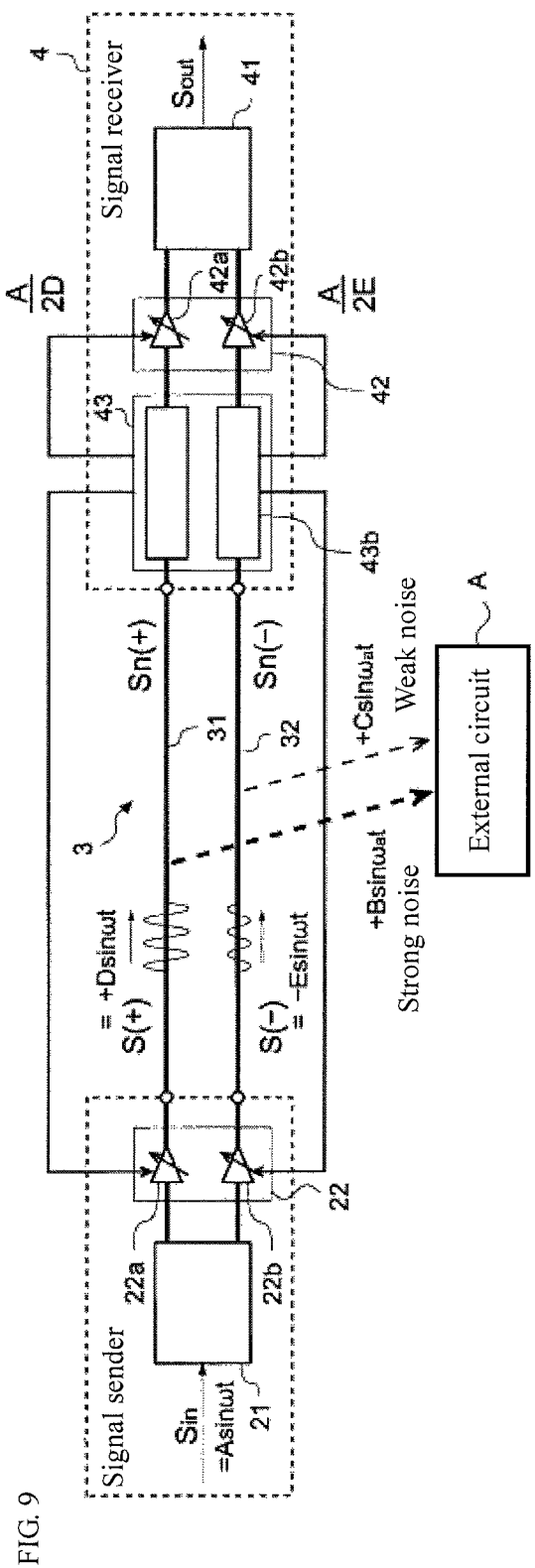

SIGNAL TRANSMISSION DEVICE AND SIGNAL TRANSMISSION METHOD

TECHNICAL FIELD

The present invention relates to a signal transmission device and a signal transmission method.

BACKGROUND TECHNOLOGY

Generally, in transmission systems of electrical signals, there are roughly two systems, that of unbalanced transmission and balanced transmission. Unbalanced transmission is a system that transmits an electrical signal using a single transmission line. Moreover, balanced transmission is a system that, as in Patent Document 1, for example, converts the electrical signal into a pair of transmission signals (differential signals) of mutually opposite phases and transmits these signals using a pair of transmission lines.

The two systems greatly differ in how they are influenced by noise received during transmission. For example, in unbalanced transmission, when the transmission line receives the noise from the outside, a noise component is superimposed on the electrical signal during transmission. Because of this, the influence of the noise received from the outside cannot be avoided.

Meanwhile, in balanced transmission, each noise component is removed when the pair of transmission signals is decoded into an electrical signal of a single phase because noise signals of identical phases and identical amplitudes are normally superimposed on each transmission signal even if the pair of transmission lines receives the noise from the outside. Therefore, the influence of the noise received from the outside can be avoided. Because of this, balanced transmission is often used in a high-speed communication systems using a high-speed communication interface, such as <LVDS, HDMI>, and in communication systems using high-frequency signals.

PRIOR ART DOCUMENTS

Patent Documents

[Patent Document 1] Japanese Unexamined Patent Application Publication No. 2002-289992

However, in balanced transmission, the noise signals of the identical phases superimposed on each transmission signal sometimes have asymmetrical amplitudes. For example, such is the case when a distance to a generation source of the noise is near or when the pair of transmission lines cannot be wired in parallel due to constraints in design. In such cases, because noise components with differing amplitudes are superimposed on each transmission signal, the influence of the noise the electrical signal receives from the outside cannot be avoided nor suppressed.

Furthermore, in Reference Document 1, noise radiated to the outside from the pair of transmission lines is reduced, but nothing is mentioned relating to suppressing the influence of the noise received from the outside as described above.

SUMMARY OF INVENTION

One or more embodiments of the present invention are made in view of such conditions and provide a signal transmission device that can effectively reduce an influence that noise signals with differing amplitudes exert on differential signals, and a signal transmission method.

A signal transmission device may comprise a signal sender that sends first and second transmission signals of mutually opposite phases, a first transmission path over which the first transmission signal is transmitted, a second transmission path over which the second transmission signal is transmitted, and a signal receiver that converts the first transmission signal received from the first transmission path and the second transmission signal received from the second transmission path into an output signal of a single phase, where the signal transmission device differentiates each amplitude of the first and second transmission signals sent from the signal sender, and the signal receiver, based on an amplitude ratio of the first and second transmission signals, converts the received first and second transmission signals.

According to the above configuration, for example, the first and second transmission signals of the mutually opposite phases adjusted to differing amplitudes are transmitted, and the transmitted first and second transmission signals are converted into the output signal of the single phase based on the amplitude ratio of the first and second transmission signals adjusted in the amplitude adjustment means. Because of this, an influence of noise signals can be reduced when the first and second transmission signals are converted into the output signal of the single phase even when noise signals with differing amplitudes are superimposed during transmission of the first and second transmission signals. Therefore, an influence the noise signals with the differing amplitudes exert on differential signals can be effectively reduced.

Furthermore, in one or more embodiments of the above configuration, the signal sender may comprise, a differential converter that converts an input signal of a single phase into the first and second transmission signals of the opposite phases, and a sending signal amplitude adjuster that adjusts each amplitude of the first and second transmission signals so the amplitude of the first transmission signal differs from the amplitude of the second transmission signal, and the signal receiver may comprise a reception signal amplitude adjuster that adjusts each amplitude of the first and second transmission signals received by the signal receiver based on the amplitude ratio of the first and second transmission signals adjusted by the sending signal amplitude adjuster, and a single phase converter that converts the first and second transmission signals adjusted by the reception signal amplitude adjuster into the output signal of the single phase.

According to this configuration, for example, the first and second transmission signals of the mutually opposite phases and the differing amplitudes can be sent from the signal sender. Moreover, conversion into the output signal of the single phase can be easily performed by adjusting based on the amplitude ratios of the first and second transmission signals adjusted by the sending signal amplitude adjuster even when the noise signals with the differing amplitudes are superimposed on the first and second transmission signals.

Furthermore, in one or more embodiments of the above configuration, the signal receiver may further comprise a detection circuit that detects the amplitudes of the first and second transmission signals received by the signal receiver, the sending signal amplitude adjuster of the signal sender independently may adjust each amplitude of the first and second transmission signals based on a detection result of the detector, and the reception signal amplitude adjuster of the signal receiver may independently adjust each amplitude of the first and second transmission signals received in the signal receiver based on the detection result of the detector.

According to this configuration, for example, amplitudes of feedback controlled first and second transmission signals can be independently adjusted. Therefore, an influence that the noise signals with the differing amplitudes exert on the output signal can be sufficiently reduced by differentiating the amplitudes of the first and second transmission signals transmitted over each transmission path even when the first and second transmission signals are feedback controlled.

Furthermore, in the signal transmission device, an impedance of the first transmission path may differ from an impedance of the second transmission path.

According to this configuration, for example, each impedance of the first and second transmission paths differs. Because of this, the amplitudes of the first and second transmission signals received by the signal receiver can be differentiated even when the amplitudes of the first and second transmission signals output from the signal sender are identical. Therefore, the influence of the noise signals with the differing amplitudes can be sufficiently reduced when the first and second transmission signals are converted into the output signal of the single phase.

Furthermore, in one or more embodiments of the above configuration, in the signal transmission device, cross-sectional areas of the first and second transmission paths may differ.

According to this configuration, for example, capacity components of the impedances of the first and second transmission paths can be differentiated.

Furthermore, in one or more embodiments of the above configuration, the signal transmission device may further comprise a dielectric layer on which the first and second transmission paths are disposed and a ground part on which the dielectric layer is provided, wherein the ground part may comprise a grounded conductor substrate, and a shortest distance between the first transmission path and the ground part may differ from a shortest distance between the second transmission path and the ground part.

According to this configuration, for example, the capacity components of the impedances of the first and second transmission paths can be differentiated.

Furthermore, in one or more embodiments of the above configuration, the dielectric layer may comprise first and second dielectric layers with differing dielectric constants, and the first transmission path may be provided on the first dielectric layer and the second transmission path may be provided on the second dielectric layer.

According to this configuration, for example, the capacity components of the impedances of the first and second transmission paths can be differentiated because the first and second transmission paths are provided on the dielectric layers with the mutually differing dielectric constants.

Alternatively, in one or more embodiments of the above configuration, the signal transmission device may further comprise a dielectric layer comprising first and second dielectric layers with differing dielectric constants, and a ground part on which the dielectric layer is provided, wherein the ground part may have a grounded conductor substrate, and the first transmission path may be provided on the first dielectric layer and the second transmission path may be provided on the second dielectric layer.

According to this configuration, for example, the capacity components of the impedances of the first and second transmission paths can be differentiated because the first and second transmission paths are provided on the dielectric layers with the mutually differing dielectric constants.

Furthermore, in one or more embodiments of the above configuration, the ground part may further comprise a conductor layer electrically connected to the conductor substrate, and the conductor layer is provided on the dielectric layer so as to overlap the second transmission path in a plan view viewed from a normal direction of a main surface of the conductor substrate.

According to this configuration, for example, the capacity components of the impedances of the first and second transmission paths can be differentiated by providing the conductor layer on the dielectric layer so as to overlap the second transmission path in the plan view.

Furthermore, in one or more embodiments of the above configuration, the conductor layer electrically connected to the conductor substrate may be provided on the dielectric layer, and the second transmission path may be disposed inside the dielectric layer and between the conductor substrate and the conductor layer.

According to this configuration, for example, the second transmission path disposed inside the dielectric layer can form two capacities, between the conductor substrate and between the conductor layer.

Furthermore, in one or more embodiments of the above configuration, the signal transmission device may set an amplitude ratio relative to a first noise signal of the first transmission signal before the first noise signal is superimposed thereon to be equivalent to an amplitude ratio relative to a second noise signal of the second transmission signal before the second noise signal is superimposed thereon.

According to this configuration, for example, when the first and second transmission signals are converted into the output signal of the single phase, the first and second noise signals can be removed substantially completely. Therefore, the influence the noise signals with the differing amplitudes exert on the differential signals can be avoided.

The signal transmission method according to one or more embodiments of the present invention may comprise sending first and second transmission signals of mutually opposite phases, transmitting the first and second transmission signals, and converting the transmitted first and second transmission signals into an output signal of a single phase, wherein at least one of either the sending or the transmitting comprises differentiating each amplitude of the transmitted first and second transmission signals, and the first and second transmission signals are converted based on an amplitude ratio of the first and second transmission signals adjusted in the differentiating.

The signal transmission method according to one or more embodiments of the present invention may further comprise converting an input signal of a single phase into the first and second transmission signals of the opposite phases, adjusting each amplitude of the first and second transmission signals so the amplitude of the first transmission signal differs from the amplitude of the second transmission signal, adjusting each amplitude of the first and second transmission signals based on the amplitude ratio of the adjusted first and second transmission signals, and converting the adjusted first and second transmission signals into the output signal of the single phase.

The signal transmission method according to one or more embodiments of the present invention may further comprise detecting an amplitudes of the first and second transmission signals received by the signal receiver, adjusting each amplitude of the first and second transmission signals based on the detection, and adjusting each amplitude of the first and second transmission signals received in the signal receiver based on the detection.

According to the above configuration, for example, the first and second transmission signals of the mutually opposite phases adjusted to differing amplitudes are transmitted, and the transmitted first and second transmission signals are converted into the output signal of the single phase based on the amplitude ratio of the first and second transmission signals adjusted in the amplitude adjustment means. Because of this, an influence of noise signals can be reduced when the first and second transmission signals are converted into the output signal of the single phase even when noise signals with differing amplitudes are superimposed during transmission of the first and second transmission signals. Therefore, the influence the noise signals with the differing amplitudes exert on the differential signals can be effectively reduced.

According to one or more embodiments of the present invention, the signal transmission device and the signal transmission method that can effectively reduce the influence that the noise signals with differing amplitudes exert on the differential signals can be provided.

BRIEF DESCRIPTION OF DRAWINGS

FIG. 9 is a conceptual block diagram for describing how electromagnetic noise radiated to the outside from the signal transmission device is mitigated according to one or more embodiments.

DETAILED DESCRIPTION OF EMBODIMENTS

Embodiments of the present invention will be described below with reference to the drawings.

First Example

Figure 1:
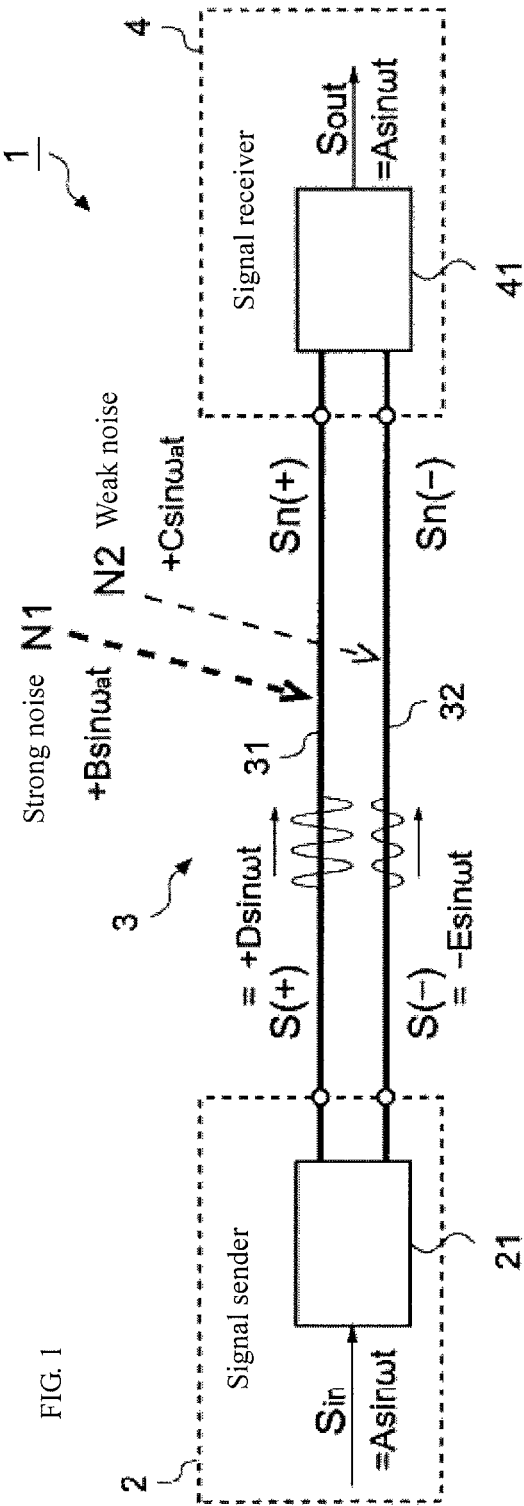
FIG. 1 is a conceptual block diagram illustrating a signal transmission device according to one or more embodiments of a first example of the present invention.

FIG. 1 is a conceptual block diagram illustrating a signal transmission device according to one or more embodiments of a first example of the present invention. As illustrated in FIG. 1, a signal transmission device 1 balance transmits an input signal Sin of a single phase from a signal sender 2 to a signal receiver 4 via a pair of transmission paths 3 to output an output signal Sout of a single phase.

The signal sender 2 includes a differential converter 21. In one or more embodiments of the first example, the differential converter 21 is an example of an amplitude adjustment means of the present invention. The differential converter 21 converts the input signal Sin of the single phase into first and second transmission signals S(+), S(−) of mutually opposite phases. The pair of transmission paths 3 are configured including a first transmission path 31 over which the first transmission signal S(+) is transmitted and a second transmission path 32 over which the second transmission signal S(−) is transmitted. Moreover, the signal receiver 4 includes a single phase converter 41. This single phase converter 41 converts first and second transmission signals Sn(+), Sn(−) received by the signal receiver 4 from the pair of transmission paths 3 into the output signal Sout of the single phase.

Next, a process where an electrical signal is balance transmitted by the signal transmission device 1 will be described with reference to FIG. 1. A sinusoidal signal Sin ($=A \sin \omega t$) of a single phase being balance transmitted will be described as an example.

First, in the signal sender 2, the differential converter 21 converts the input signal Sin of the single phase into differential signals configured by the pair of transmission signals S(+), S(−) so as to satisfy formulas 1 and 2 below. By this conversion, the first transmission signal S(+) ($=+D \sin \omega t$) and the second transmission signal S(−) ($=-E \sin \omega t$) are generated. These first and second transmission signals S(+), S(−) are signals of mutually opposite phases and differing amplitudes (referred to hereinbelow as asymmetrical amplitudes).

$$E*S(+)+D*S(-)=0 \quad \text{(Formula 1)}$$

$$E*S(+)-D*S(-)=\text{Sin} \quad \text{(Formula 2)}$$

Here, $\omega$ indicates angular frequencies of the input signal Sin of the single phase and the first and second transmission signals S(+), S(−), and t indicates a time. Moreover, A, D, and E respectively indicate each amplitude of the input signal Sin of the single phase and the first and second transmission signals S(+), S(−). According to formula 2, amplitudes A, D, and E satisfy formula 3 below.

$$2DE=A \quad \text{(Formula 3)}$$

Furthermore, the amplitudes D and E are set according to amplitudes B, C (B>C) of first and second noise signals N1, N2 that will be described below. More specifically, they are set so an amplitude ratio of the first transmission signal S(+) relative to the first noise signal N1 is equivalent to an amplitude ratio of the second transmission signal S(−) relative to the second noise signal N2. That is, the amplitudes D and E are set to also satisfy formula 4 below.

$$E:C=D:B$$

$$EB=CD \quad \text{(Formula 4)}$$

The first and second transmission signals S(+), S(−) generated in this manner are output from the signal sender 2 and transmitted over the first and second transmission paths 31, 32. Here, when the first and second transmission paths 31, 32 receive an influence of external noise during transmission, the first and second noise signals N1 (=+B sin ωat), N2 (=+C sin ωat) of identical phases are superimposed thereon. Here, B and C respectively indicate amplitudes of the first and second noise signals N1, N2, and ωa indicates angular frequencies of the first and second noise signals N1, N2.

Because of this, the signal receiver 4 receives from the first and second transmission paths 31, 32 the first and second transmission signals Sn(+), Sn(−) superimposed with each noise signal such as illustrated in formulas 5 and 6 below.

$$Sn(+) = S(+) + N1 \quad \text{(formula 5)}$$
$$= +D\sin\omega t + B\sin\omega at$$

$$Sn(-) = S(-) + N2 \quad \text{(formula 6)}$$
$$= -E\sin\omega t + C\sin\omega at$$

In the signal receiver 4, the single phase converter 41 converts the first and second transmission signals Sn(+), Sn(−) superimposed with each noise signal N1, N2 into the output signal Sout of the single phase. As in formula 7 below, this conversion is performed based on amplitude ratios of the first and second transmission signals S(+), S(−) before each noise signal N1, N2 is superimposed thereon.

$$Sout = ESn(+) - DSn(-) \quad \text{(Formula 7)}$$

Here, each amplitude of the differential signals (first and second transmission signals S(+), S(−)) is set so as to satisfy conditions of formula 4 described above. Therefore, when the single phase converter 41 generates the output signal Sout of the single phase, the first and second noise signals N1, N2 are removed as in formula 8 below.

$$Sout = E\{+D\sin\omega t + B\sin\omega at\} - \quad \text{(formula 8)}$$
$$D\{-E\sin\omega t + C\sin\omega at\}$$
$$= 2DE\sin\omega t + (EB - CD)\sin\omega at$$
$$= A\sin\omega t$$

Furthermore, the first and second noise signals N1, N2 of the identical phases superimposed on the first and second transmission signals S(+), S(−) are removed regardless whether they have identical amplitudes or asymmetrical amplitudes (differing amplitudes). Therefore, in the signal transmission device 1, an influence the external noise exerts on the differential signals can be avoided.

A configuration described above is particularly effective when the amplitudes B, C of the first and second noise signals N1, N2 superimposed on the first and second transmission signals S(+), S(−) substantially do not change. When the amplitudes B, C of the first and second noise signals N1, N2 change, support is possible by suitably changing a setting in the signal sender 2 of conditions for conversion into the differential signals and a setting in the signal receiver 4 of conditions for conversion into the single phase signal Sout. Moreover, even if the amplitudes B, C of the first and second noise signals N1, N2 do not satisfy the conditions of formula 4 described above, it is possible to effectively reduce a noise component superimposed on the output signal Sout of the single phase. In this situation, it is sufficient for a noise signal with a larger amplitude (for example, the first noise signal N1) from among the first and second noise signals N1, N2 of the asymmetrical amplitudes to be superimposed on a transmission signal with a larger amplitude (for example, the first transmission signal S(+)) from among the first and second transmission signals S(+), S(−) of the asymmetrical amplitudes. For example, when the amplitudes of the first and second noise signals N1, N2 are such that B>C, it is sufficient that the amplitudes of the first and second transmission signals S(+), S(−) are such that D>E.

First Comparative Example

Figure 2:
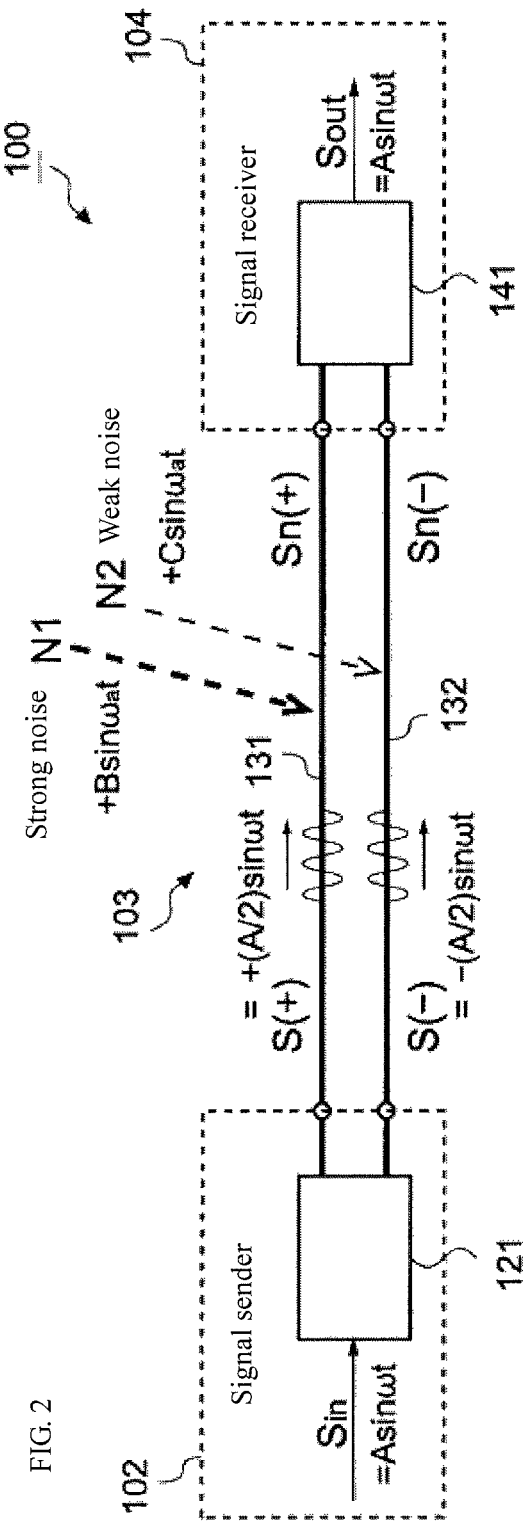
FIG. 2 is a conceptual block diagram illustrating a signal transmission device according to one or more embodiments of a first comparative example.

Next, a first comparative example for facilitating understanding of effects of the signal transmission device 1 of one or more embodiments of the present invention will be described. FIG. 2 is a conceptual block diagram illustrating a signal transmission device according to the first comparative example. As illustrated in FIG. 2, in a signal transmission device 100 of the first comparative example, the input signal Sin is converted into differential signals of opposite phases and identical amplitudes and balance transmitted.

In the first comparative example, in a signal sender 102, a differential converter 121 converts the input signal Sin of the single phase into the differential signals configured by the pair of transmission signals S(+), S(−) so as to satisfy formula 9 below. By this conversion, the first transmission signal S(+) (=+(A/2)sin ωt) and the second transmission signal S(−) (=−(A/2)sin ωt) of the opposite phases and the identical amplitudes are generated.

$$S(+)+S(-)=0$$
$$S(+)-S(-)=\text{Sin} \quad \text{(Formula 9)}$$

The first and second transmission signals S(+), S(−) generated in this manner are output from the signal sender 102. Then, in first and second transmission paths 131, 132, the first and second noise signals N1 (=+B sin ωt), N2 (=+C sin ωat) of the identical phases are superimposed thereon.

A signal sender 104 receives from the first and second transmission paths 131, 132 the first and second transmission signals Sn(+), Sn(−) superimposed with each noise signal N1, N2. As in formula 10 below, a single phase converter 141 converts the first and second transmission signals Sn(+), Sn(−) superimposed with each noise signal N1, N2 into the output signal Sout of the single phase.

$$Sout = Sn(+) - Sn(-) \quad \text{(formula 10)}$$
$$Sout = \{+(A/2)\sin\omega t + B\sin\omega at\} - \{-(A/2)\sin\omega t + C\sin\omega at\}$$
$$= A\sin\omega t + (B - C)\sin\omega at$$

Here, if the first and second noise signals N1, N2 have identical amplitudes (that is, B=C), they can be removed from the first and second transmission signals Sn(+), Sn(−), but if they have asymmetrical amplitudes (that is, B≠C), they cannot be removed. Therefore, in the signal transmission device 100 of the first comparative example, the influence the noise signals N1, N2 with differing amplitudes exert on the differential signals cannot be avoided.

Embodiments of the first example of the present invention have been described above. According to the first example, the signal transmission device 1 is provided with the signal sender 2, the first transmission path 31, the second transmission path 32, and the signal receiver 4. The signal sender 2 sends the first and second transmission signals S(+), S(−) of the mutually opposite phases. The first transmission signal S(+) is transmitted over the first transmission path 31, and the second transmission signal S(−) is transmitted over the second transmission path 32. The signal receiver 4 converts the first transmission signal Sn(+) received from the first transmission path 31 and the second transmission signal Sn(−) received from the second transmission path 32 into the output signal Sout of the single phase. Moreover, the differential converter 21 (amplitude adjustment means) that differentiates each amplitude of the first and second transmission signals S(+), S(−) received by the signal receiver 4 is provided in the signal sender 2. The signal receiver 4 converts the received first and second transmission signals S(+), S(−) based on the amplitude ratio of the first and second transmission signals S(+), S(−) adjusted in the differential converter 21.

Furthermore, according to the first example, a signal transmission method is provided with the steps below. In one step, the first and second transmission signals S(+), S(−) of the mutually opposite phases are sent. In one step, the first and second transmission signals S(+), S(−) are transmitted. In one step, the first and second transmission signals Sn(+), Sn(−) transmitted in the transmitting step are converted into the output signal Sout of the single phase. Moreover, the sending step described above includes the step of differentiating each amplitude of the first and second transmission signals S(+), S(−) transmitted in the transmitting step described above. Then, in the converting step described above, the first and second transmission signals Sn(+), Sn(−) transmitted in the transmitting step described above are converted based on the amplitude ratio of the first and second transmission signals S(+), S(−) adjusted in the differentiating step described above.

By configuring in this manner, the first and second transmission signals S(+), S(−) of the mutually opposite phases adjusted to the differing amplitudes are transmitted. Then, the transmitted first and second transmission signals Sn(+), Sn(−) are converted into the output signal Sout of the single phase based on the amplitude ratio of the first and second transmission signals S(+), S(−) adjusted in the differential converter 21. Because of this, the influence of the noise signals N1, N2 can be reduced when the first and second transmission signals Sn(+), Sn(−) are converted into the output signal Sout of the single phase even when the noise signals N1, N2 with the differing amplitudes are superimposed thereon during transmission of the first and second transmission signals S(+), S(−). Therefore, the influence the noise signals N1, N2 with the differing amplitudes exert on the differential signals can be effectively reduced.

Furthermore, in the signal transmission device 1 of the first example, the differential converter 21 sets the amplitude ratio (D:B) relative to the first noise signal N1 of the first transmission signal S(+) before the first noise signal N1 is superimposed thereon to be equivalent to the amplitude ratio (E:C) relative to the second noise signal N2 of the second transmission signal S(−) before the second noise signal N2 is superimposed thereon. By configuring in this manner, when the first and second transmission signals Sn(+), Sn(−) are converted into the output signal Sout of the single phase, the first and second noise signals N1, N2 can be removed substantially completely. Therefore, the influence the noise signals N1, N2 with the differing amplitudes exert on the differential signals can be avoided.

Modified Example of First Example

Figure 3:
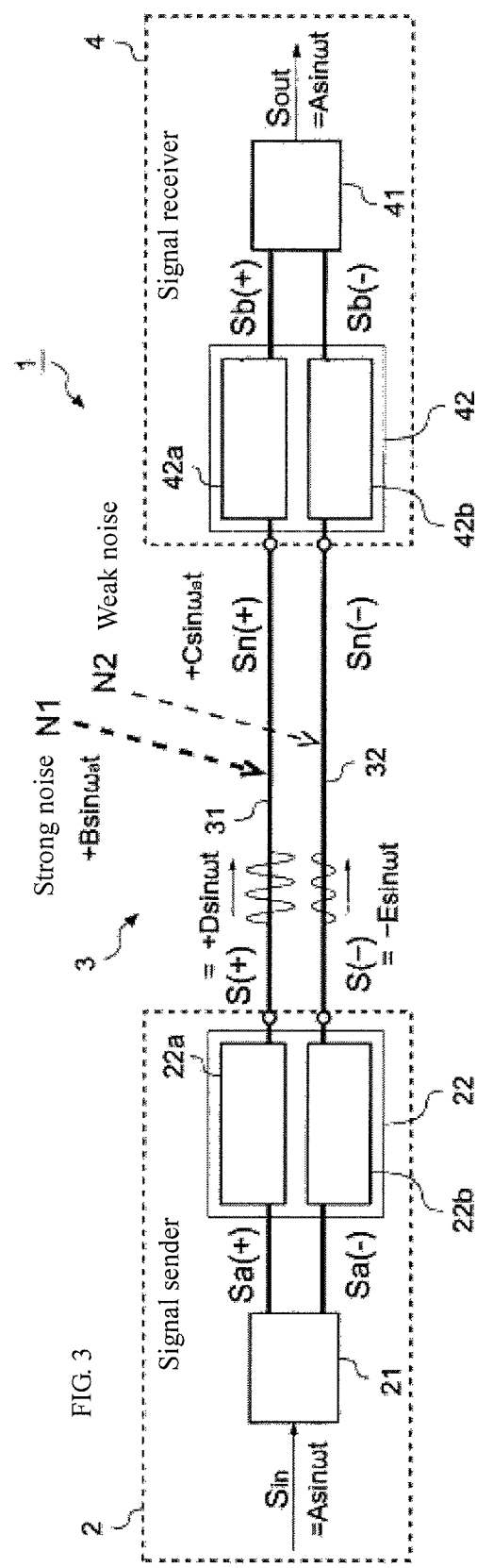
FIG. 3 is a conceptual block diagram illustrating a signal transmission device according to one or more embodiments of a modified first example.

In the first example described above, the differential converter 21 bears both a function of converting from the input signal Sin of the single phase to the differential signals and a function of adjusting each amplitude D, E of the differential signals, but a configuring part may be provided for each function. FIG. 3 is a conceptual block diagram illustrating an example of a signal transmission device according to a modified first example.

As illustrated in FIG. 3, the signal sender 2 of the signal transmission device 1 further includes a sending signal amplitude adjuster 22. In one or more embodiments of the modified first example, the sending signal amplitude adjuster 22 is an example of the amplitude adjustment means of the present invention.

The differential converter 21 converts the input signal Sin of the single phase into first and second transmission signals Sa(+), Sa(−) of mutually opposite phases and identical amplitudes. The sending signal amplitude adjuster 22 is configured including first and second sending signal amplitude adjusters 22a, 22b. The first sending signal amplitude adjuster 22a adjusts an amplitude of the first transmission signal Sa(+) generated in the differential converter 21 to the amplitude D that satisfies the conditions of formula 4. Moreover, the second sending signal amplitude adjuster 22b adjusts an amplitude of the second transmission signal Sa(−) generated in the differential converter 21 to the amplitude E that satisfies the conditions of formula 4.

Furthermore, the signal receiver 4 further includes a reception signal amplitude adjuster 42. The reception signal amplitude adjuster 42 is configured including first and second reception signal amplitude adjusters 42a, 42b. The first reception signal amplitude adjuster 42a adjusts the amplitude of the first transmission signal Sn(+) with the first noise signal N1 superimposed thereon to be multiplied by E. Moreover, the second reception signal amplitude adjuster 42b adjusts the amplitude of the second transmission signal Sn(−) with the second noise signal N2 superimposed thereon to be multiplied by D. The single phase converter 41 converts adjusted first and second transmission signals ESb(+), DSb(−) into the output signal Sout of the single phase by calculating as in formula 11 below.

$$\begin{aligned}Sout &= ESn(+) - DSn(-) \\ &= E\{+D\sin\omega t + B\sin\omega at\} - \\ &\quad D\{-E\sin\omega t + C\sin\omega at\} \\ &= 2DE\sin\omega t + (EB - CD)\sin\omega at \\ &= A\sin\omega t\end{aligned} \qquad \text{(formula 11)}$$

In FIG. 3, the sending signal amplitude adjuster 22 of the signal sender 2 adjusts each amplitude of the first and second transmission signals S(+), S(−) to be D and E but may adjust them to be 1 and (E/D) or (D/E) and 1. However, when adjusting in this manner, it is sufficient for the reception signal amplitude adjuster 42 of the signal receiver 4 to adjust each amplitude of the first and second transmission signals Sn(+), Sn(−) to be multiplied by (E/D) and 1 or by 1 and (D/E).

Embodiments of the modified first example of the present invention have been described above. According to one or more embodiments of the signal transmission device 1 of this modified example, the signal sender 2 includes the differential converter 21 and the sending signal amplitude adjuster 22. The differential converter 21 converts the input signal Sin of the single phase into the first and second transmission signals Sa(+), Sa(−) of the mutually opposite phases. The sending signal amplitude adjuster 22 adjusts each amplitude D, E of the first and second transmission signals S(+), S(−) so the amplitude D of the first transmission signal S(+) differs from the amplitude E of the second transmission signal S(−). Moreover, the signal receiver 4 further includes the reception signal amplitude adjuster 42 and the single phase converter 41. The reception signal amplitude adjuster 42 adjusts each amplitude of the first and second transmission signals Sn(+), Sn(−) received by the signal receiver 4 based on the amplitude ratios of the first and second transmission signals S(+), S(−) adjusted by the sending signal amplitude adjuster 22. The single phase converter 41 converts the first and second transmission signals Sb(+), Sb(−) adjusted by the reception signal amplitude adjuster 42 into the output signal Sout of the single phase.

By configuring in this manner, the first and second transmission signals S(+), S(−) of the mutually opposite phases and the differing amplitudes can be sent from the signal sender 2. Moreover, conversion into the output signal Sout of the single phase can be easily performed by adjusting based on the amplitude ratios of the first and second transmission signals S(+), S(−) adjusted by the sending signal amplitude adjuster 22 even when the noise signals N1, N2 with the differing amplitudes are superimposed on the first and second transmission signals S(+), S(−).

Furthermore, one or more embodiments of the first example above describe a configuration that avoids the influence that the external noise exerts on the differential signals transmitted over the pair of transmission paths 3 when the differential signals of the opposite phases and the asymmetrical amplitudes are output from the signal sender 2. Next, a configuration will be described that can avoid the influence of the external noise even when the differential signals of the opposite phases and the identical amplitudes are output from the signal sender 2.

Second Example

Embodiments of a second example will be described. In one or more embodiments of the second example, the differential signals of the opposite phases and the asymmetrical amplitudes are received by the signal receiver 4 by differentiating each impedance Z1, Z2 of the pair of transmission paths 3 over which the differential signals are transmitted. That is, in the second example, the pair of transmission paths 3 is an example of the amplitude adjustment means of the present invention. Items concerning the second example differing from the first example will be described below. Moreover, identical reference codes will be attached to configurations identical or substantially identical to those in the first example, and description thereof may be omitted.

Figure 4:
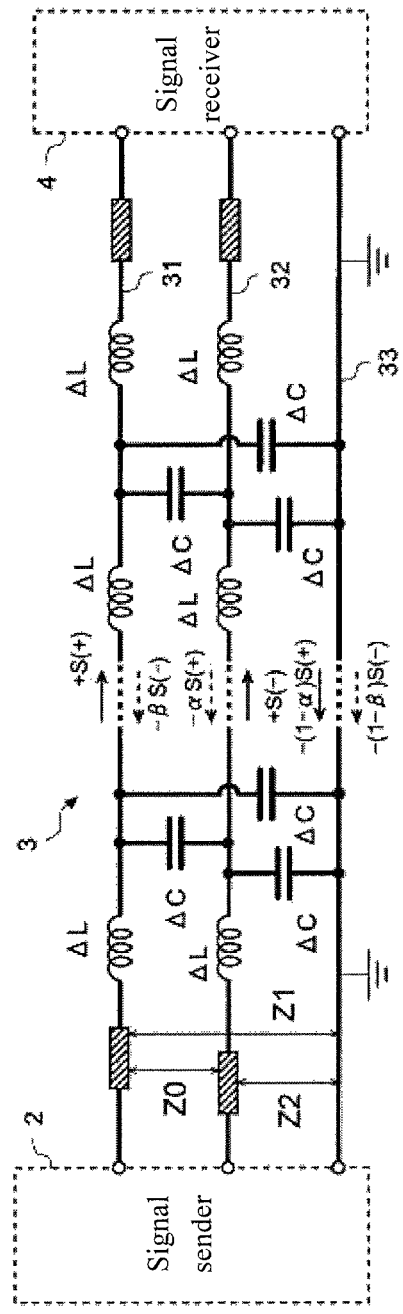
FIG. 4 is an equivalent circuit diagram of transmission paths taking into consideration an actual unbalanced transmission component according to one or more embodiments.

First, in ideal balanced transmission, the differential signals are transmitted over the pair of transmission paths 3, but in actuality, the transmission paths 3 also cannot ignore, for example, a ground pattern and electrical coupling with another signal path. Because of this, a certain level of an unbalanced transmission component is included in actual balanced transmission. FIG. 4 is an equivalent circuit diagram of the transmission paths taking into consideration the actual unbalanced transmission component.

The transmission paths 3 in FIG. 4 are configured including the first and second transmission paths 31, 32 as well as a grounded reference path 33. Moreover, in FIG. 4, the squares hatched with the diagonal lines illustrate widths of the first and second transmission paths 31, 32 and represent the impedances Z1, Z2 of each transmission path 31, 32. Moreover, $\Delta L$ and $\Delta C$ are inductors and capacitors in small sections of the paths and represent inductance components and capacitor components of the impedances Z1, Z2 of each transmission path 31, 32.

The first and second transmission signals S(+), S(−) of the mutually opposite phases are input to the first and second transmission paths 31, 32 and transmitted from the signal sender 2 to the signal receiver 4. Moreover, feedback signals of the first and second transmission signals S(+), S(−) are output from the signal receiver 4 to each path 31 to 33, but a portion of each feedback current flows to the reference path 33. For example, a portion $-\alpha S(+)$ ($0<\alpha<1$) of a feedback current $-S(+)$ of the first transmission signal $+S(+)$ flows through the second transmission path 32, but a remaining portion $-(1-\alpha)S(+)$ flows through the reference path 33. Moreover, a portion $-\beta S(-)$ ($0<\beta<1$) of a feedback current $-S(-)$ of the second transmission signal $+S(-)$ flows through the first transmission path 31, but a remaining portion $-(1-\beta)S(-)$ flows through the reference path 33. $\alpha$ and $\beta$ are such that $\alpha=\beta$ when the impedances Z1, Z2 of the first and second transmission paths 31, 32 are identical, but $\alpha \neq \beta$ when the impedances Z1, Z2 differ.

Figure 5A:
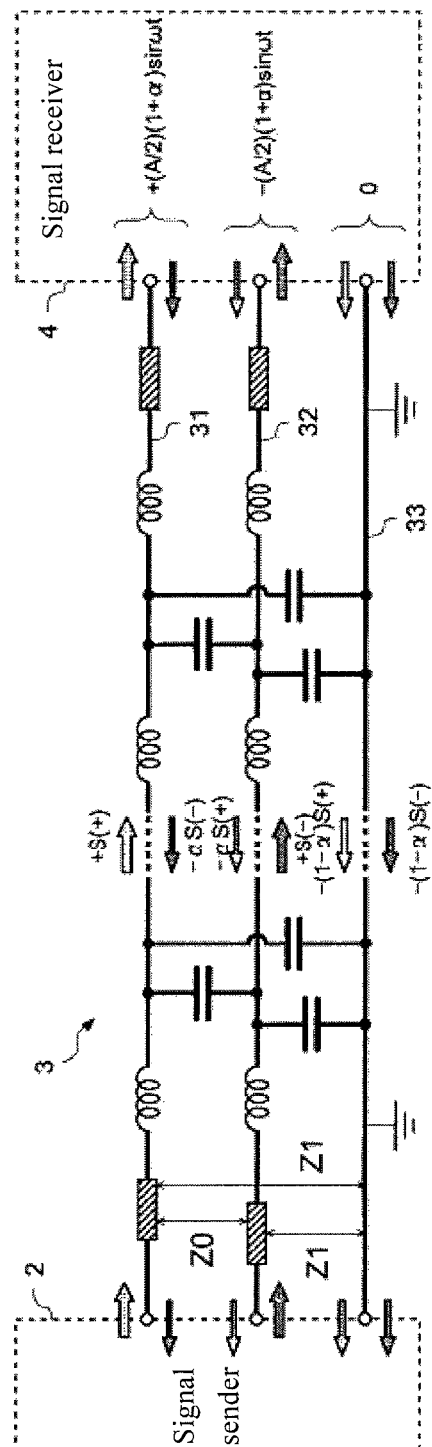
FIG. 5A is an equivalent circuit diagram in a situation where differential signals of opposite phases and identical amplitudes are transmitted over transmission paths without a difference in impedances according to one or more embodiments.
Figure 5B:
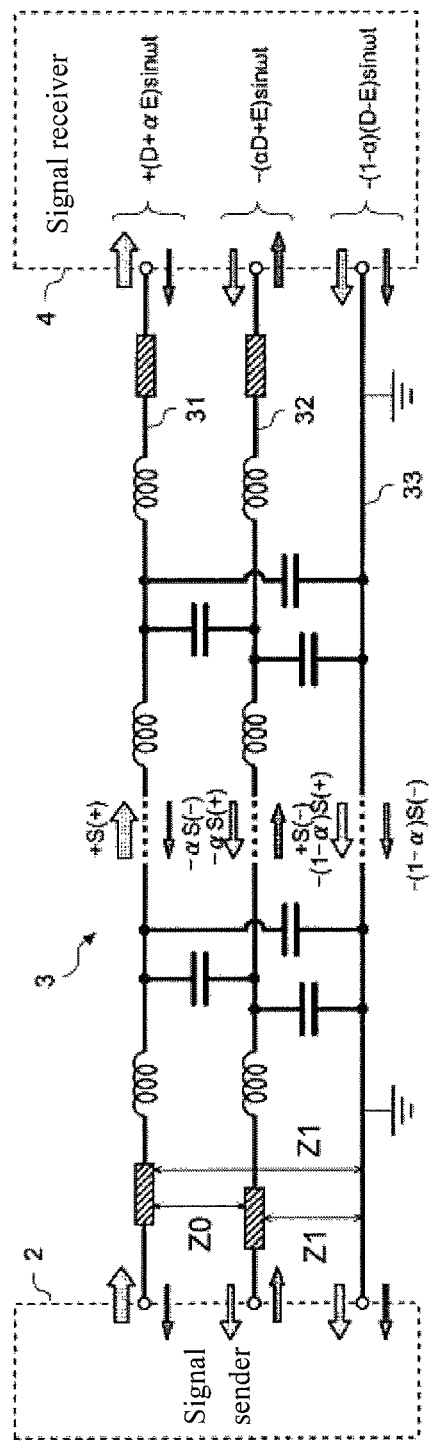
FIG. 5B is an equivalent circuit diagram in a situation where differential signals of opposite phases and differing amplitudes are transmitted over the transmission paths without a difference in the impedances according to one or more embodiments.

First, a situation where the impedances Z1, Z2 of the first and second transmission paths 31, 32 are substantially identical will be described. FIG. 5A is an equivalent circuit diagram in a situation where the differential signals of the opposite phases and the identical amplitudes are transmitted to the transmission paths without a difference in impedances. Moreover, FIG. 5B is an equivalent circuit diagram in a situation where the differential signals of the opposite phases and the differing amplitudes are transmitted to the transmission paths without the difference in impedances. The description will be omitted for superimposition of the first and second noise signals N1, N2 to facilitate understanding of an action exerted on the differential signals by an action of each impedance Z1, Z2 of the first and second transmission paths 31, 32.

When the first and second transmission signals S(+) (=+(A/2)sin ωt), S(−)−(A/2)sin ωt) of the opposite phases and the identical amplitudes are transmitted over the transmission paths 3, as illustrated in FIG. 5A, the first transmission signal Sn(+) received by the signal receiver 4 becomes +(A/2)(1+α) sin ωt and the second transmission signal Sn(−) becomes −(A/2)(1+α)sin ωt. That is, the signal receiver 4 receives the differential signals of the opposite phases and the identical amplitudes.

Meanwhile, when the first and second transmission signals S(+) (=+D sin ωt), S(−) (=−E sin ωt) of the opposite phases and the differing amplitudes are transmitted over the transmission paths 3, as illustrated in FIG. 5B, the first transmission signal Sn(+) received by the signal receiver 4 becomes +(D+αE)sin ωt and the second transmission signal Sn(−) becomes −(aD+E)sin ωt. That is, the signal receiver 4 receives the differential signals of the opposite phases and the differing amplitudes.

Figure 6:
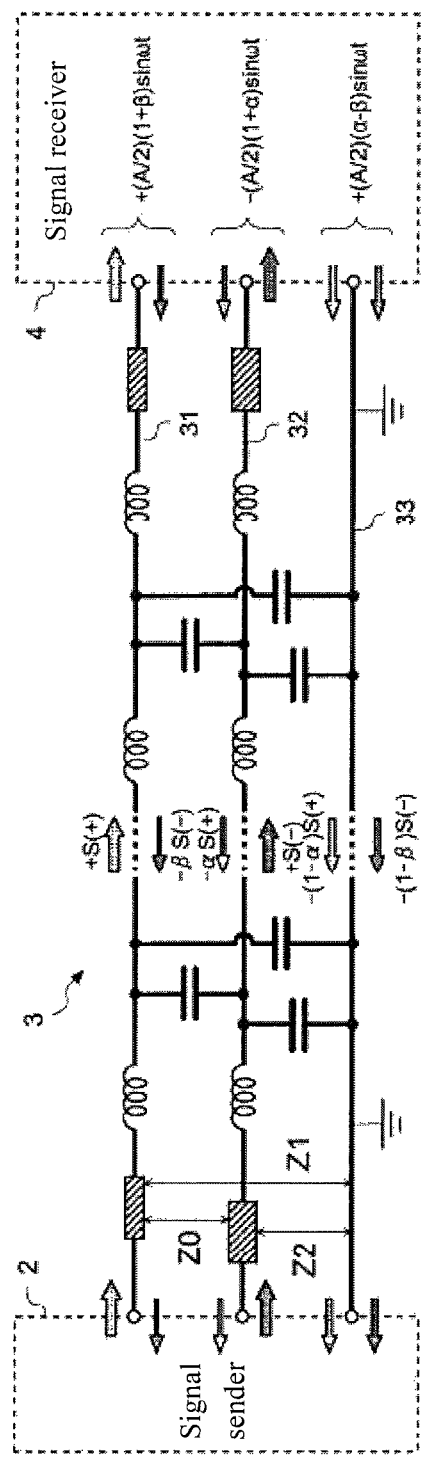
FIG. 6 is an equivalent circuit diagram in a situation where the differential signals of the opposite phases and the identical amplitudes are transmitted over transmission paths where the impedances differ according to one or more embodiments.

Next, a situation where the impedances Z1, Z2 of the first and second transmission paths 31, 32 differ will be described. FIG. 6 is an equivalent circuit diagram in a situation where the differential signals of the opposite phases and the identical amplitudes are transmitted to the transmission paths where the impedances differ. The description will be omitted for superimposition of the first and second noise signals N1, N2 to facilitate understanding of the action exerted on the differential signals by the action of each impedance Z1, Z2 of the first and second transmission paths 31, 32.

When the first and second transmission signals S(+) (=+(A/2)sin ωt), S(−) (=−(A/2)sin ωt) of the opposite phases and the identical amplitudes are transmitted over the transmission paths 3, as illustrated in FIG. 6, the first transmission signal Sn(+) received by the signal receiver 4 becomes $+(A/2)(1+\beta)$ sin ωt and the second transmission signal Sn(−) becomes $-(A/2)(1+a)$sin ωt. That is, the signal receiver 4 receives the differential signals of the opposite phases and the differing amplitudes even if the differential signals of the opposite phases and the identical amplitudes are transmitted from the signal sender 2.

Such transmission paths 3 can be realized by differentiating at least one from among resistance components, capacity components, and inductance components of each impedance Z1, Z2 of the first and second transmission paths 31, 32. Specific configuration examples of the transmission paths 3 with differing impedances Z1, Z2 will be described below using first to sixth working examples.

First Working Example

Figure 7A:
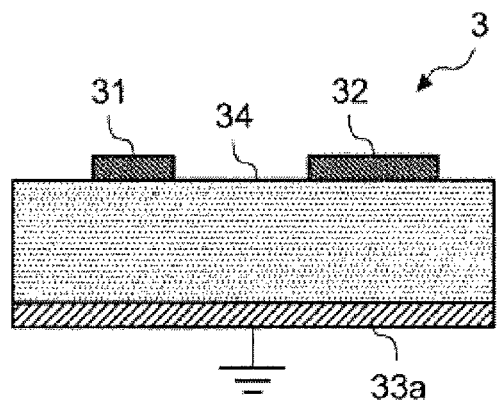
FIG. 7A is a diagram illustrating transmission paths according to one or more embodiments of a second example of the present invention.

FIG. 7A is a diagram illustrating transmission paths according to one or more embodiments of the second example. In the transmission paths 3 in FIG. 7A, a dielectric layer 34 is formed on a grounded conductor substrate 33a. Moreover, the first and second transmission paths 31, 32 with differing cross-sectional areas are disposed on an upper surface of the dielectric layer 34. By configuring in this manner, each capacity component of the impedances Z1, Z2 of the first and second transmission paths 31, 32 can be differentiated. In the first working example, the conductor substrate 33a is a portion of a ground part of the present invention.

Second Working Example

Figure 7B:
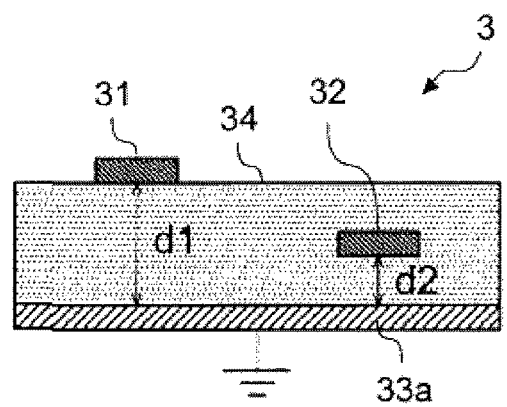
FIG. 7B is a diagram illustrating transmission paths according to one or more embodiments of the second example.

FIG. 7B is a diagram illustrating transmission paths according to one or more embodiments of the second example. In the transmission paths 3 in FIG. 7B, the dielectric layer 34 is formed on the grounded conductor substrate 33a. Moreover, the first transmission path 31 is disposed on the dielectric layer 34, but the second transmission path 32 is disposed inside the dielectric layer 34. By configuring in this manner, each capacity component of the impedances Z1, Z2 of the first and second transmission paths 31, 32 can be differentiated because gaps d1, d2 between the first and second transmission paths 31, 32 and the conductor substrate 33a differ. In one or more embodiments of the second working example, the conductor substrate 33a is a portion of the ground part of the present invention.

Third Working Example

Figure 7C:
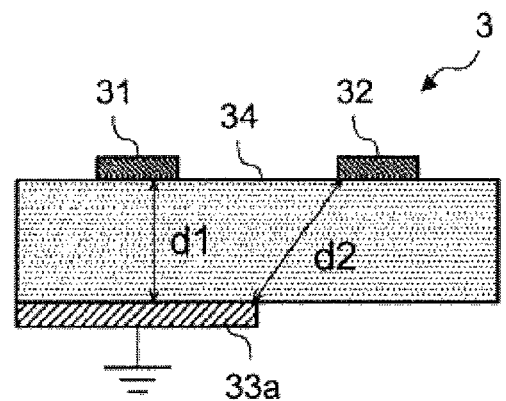
FIG. 7C is a diagram illustrating transmission paths according to one or more embodiments of the second example.

FIG. 7C is a diagram illustrating transmission paths according to one or more embodiments of the second example. In the transmission paths 3 in FIG. 7C, the first and second transmission paths 31, 32 are disposed on the upper surface of the dielectric layer 34. Moreover, the grounded conductor substrate 33a is provided on a portion of a lower surface of the dielectric layer 34. In a plan view viewed from a normal direction of a main surface of the conductor substrate 33a, the first transmission path 31 overlaps the conductor substrate 33a, but the second transmission path 32 does not overlap the conductor substrate 33a. Even by configuring in this manner, each capacity component of the impedances Z1, Z2 of the first and second transmission paths 31, 32 can be differentiated because each gap d1, d2 between the first and second transmission paths 31, 32 and the conductor substrate 33a can be easily differentiated. In the third working example, the conductor substrate 33a is a portion of the ground part of the present invention.

Fourth Working Example

Figure 7D:
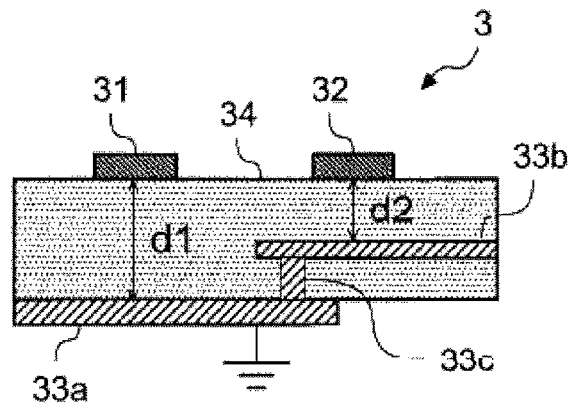
FIG. 7D is a diagram illustrating transmission paths according to one or more embodiments of the second example.

FIG. 7D is a diagram illustrating transmission paths according to one or more embodiments of the second example. In the transmission paths 3 in FIG. 7D, the first and second transmission paths 31, 32 are disposed on the upper surface of the dielectric layer 34. Moreover, the grounded conductor substrate 33a is provided on a portion of the lower surface of the dielectric layer 34. Moreover, a conductor layer 33b is provided inside the dielectric layer 34. This conductor layer 33b is conducted with the conductor substrate 33a via the via hole 33c with a conduction path formed inside. Moreover, in the plan view viewed from the normal direction of the main surface of the conductor substrate 33a, the first transmission path 31 does not overlap the conductor layer 33b but the second transmission path 32 overlaps the conductor layer 33b. Even by configuring in this manner, each capacity component of the impedances Z1, Z2 of the first and second transmission paths 31, 32 can be differentiated because the gap d1 between the first transmission path 31 and the conductor substrate 33a and the gap d2 between the second transmission path 32 and the conductor layer 33b can be easily differentiated. In one or more embodiments of the fourth working example, the conductor substrate 33a, the conductor layer 33b, and the via hole 33c are portions of the ground part of the present invention.

Fifth Working Example

Figure 7E:
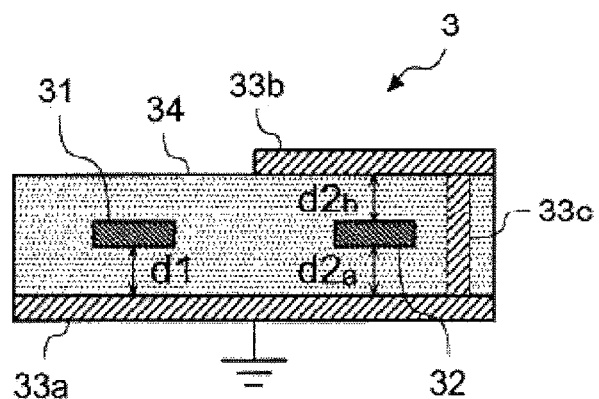
FIG. 7E is a diagram illustrating transmission paths according to one or more embodiments of the second example.

FIG. 7E is a diagram illustrating transmission paths according to one or more embodiments of the second example. In the transmission paths 3 in FIG. 7E, the dielectric layer 34 is formed on the grounded conductor substrate 33a. Moreover, the first and second transmission paths 31, 32 are disposed inside the dielectric layer 34. Moreover, the conductor layer 33b is provided on a portion of the upper surface of the dielectric layer 34, and this conductor layer 33b is conducted with the conductor substrate 33a via the via hole 33c with the conduction path formed inside. Moreover, in the plan view viewed from the normal direction of the main surface of the conductor substrate 33a, the first transmission path 31 does not overlap the conductor layer 33b but the second transmission path 32 overlaps the conductor layer 33b. Because of this, the second transmission path 32 is disposed inside the dielectric layer 34 and between the conductor substrate 33a and the conductor layer 33b. By configuring in this manner, each capacity component of the impedances Z1, Z2 of the first and second transmission paths 31, 32 can be differentiated because the second transmission path 32 disposed inside the dielectric layer 34 can form two capacity components, in a gap d2a between the conductor substrate 33a and in a gap d2b between the conductor layer 33b. In one or more embodiments of the fifth working example, the conductor substrate 33a, the conductor layer 33b, and the via hole 33c are portions of the ground part of the present invention.

Sixth Working Example

Figure 7F:
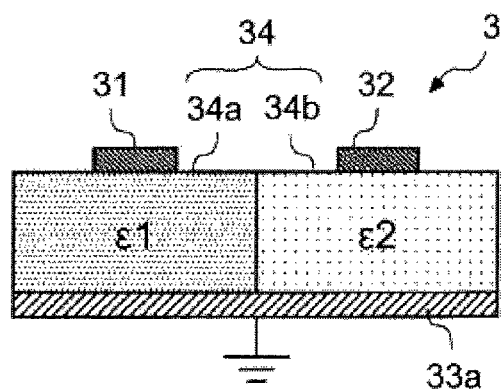
FIG. 7F is a diagram illustrating transmission paths according to one or more embodiments of the second example.

FIG. 7F is a diagram illustrating transmission paths according to one or more embodiments of the second example. In the transmission paths 3 in FIG. 7F, two dielectric layers 34a, 34b with differing dielectric constants are formed on the grounded conductor substrate 33a. Moreover, the first transmission path 31 is disposed on an upper surface of the one dielectric layer 34a, and the second transmission path 32 is disposed on an upper surface of the other dielectric layer 34b. Each capacity component of the impedances Z1, Z2 of the first and second transmission paths 31, 32 can be differentiated because dielectric constants 81, c2 between the first and second transmission paths 31, 32 and the conductor substrate 33a differ. In one or more embodiments of the sixth working example, the conductor substrate 33a is a portion of the ground part of the present invention.

The configuration examples of the transmission paths 3 are not limited to the first to sixth working examples described above. For example, each cross-sectional area of the first and second transmission paths 31, 32 may be differentiated in the second to sixth working examples. By configuring in this manner, each capacity component of the impedances Z1, Z2 of the first and second transmission paths 31, 32 can be further differentiated.

Embodiments of the second example of the present invention have been described above. The signal transmission device 1 of the second example is provided with the signal sender 2, the first transmission path 31, the second transmission path 32, and the signal receiver 4. The signal sender 2 sends the first and second transmission signals S(+), S(−) of the mutually opposite phases. The first transmission signal S(+) is transmitted over the first transmission path 31, and the second transmission signal S(−) is transmitted over the second transmission path 32. The signal receiver 4 converts the first transmission signal Sn(+) received from the first transmission path 31 and the second transmission signal Sn(−) received from the second transmission path 32 into the output signal Sout of the single phase. Moreover, (because the impedances Z1, Z2 mutually differ,) the first and second transmission paths 31, 32 function as the amplitude adjustment means that differentiates each amplitude of the first and second transmission signals Sn(+), Sn(−) received by the signal receiver 4. Then, the signal receiver 4 converts the received first and second transmission signals Sn(+), Sn(−) based on the amplitude ratio of the first and second transmission signals S(+), S(−) adjusted by the amplitude adjustment means.

By configuring in this manner, the first and second transmission signals S(+), S(−) of the mutually opposite phases adjusted to the differing amplitudes are transmitted. Then, the transmitted first and second transmission signals Sn(+), Sn(−) are converted into the output signal Sout of the single phase based on the amplitude ratio of the first and second transmission signals S(+), S(−) adjusted in the first and second transmission paths 31, 32 functioning as the amplitude adjustment means. Because of this, the influence of the noise signals N1, N2 can be reduced when the first and second transmission signals Sn(+), Sn(−) are converted into the output signal Sout of the single phase even when the noise signals N1, N2 with the differing amplitudes are superimposed on the first and second transmission signals S(+), S(−) during transmission of the first and second transmission signals S(+), S(−). Therefore, the influence the noise signals N1, N2 with the differing amplitudes exert on the differential signals can be effectively reduced.

Furthermore, according to one or more embodiments of the signal transmission device 1 of the second example, the impedance Z1 of the first transmission path 31 differs from the impedance Z2 of the second transmission path 32. Because of this, the amplitudes of the first and second transmission signals Sn(+), Sn(−) received by the signal receiver 4 can be differentiated even when the amplitudes of the first and second transmission signals S(+), S(−) output from the signal sender 2 are identical. Therefore, the influence of the noise signals N1, N2 with the differing amplitudes can be sufficiently reduced when the first and second transmission signals Sn(+), Sn(−) are converted into the output signal Sout of the single phase.

Examples below can be mentioned as methods of differentiating each impedance Z1, Z2 of the first and second transmission paths 31, 32. For example, the cross-sectional areas of the first and second transmission paths 31, 32 may be different in the second example. By configuring in this manner, the capacity components of the impedances Z1, Z2 of the first and second transmission paths 31, 32 can be differentiated.

Furthermore, in one or more embodiments of the second example, the signal transmission device 1 may be further provided with the dielectric layer 34 on which the first and second transmission paths 31, 32 are disposed and the ground part on which the dielectric layer 34 is provided. Moreover, the ground part may have the grounded conduction substrate 33a, and the shortest distance between the first transmission path 31 and the ground part may differ from the shortest distance between the second transmission path 32 and the ground part. By configuring in this manner, the capacity components of the impedances Z1, Z2 of the first and second transmission paths 31, 32 can be differentiated.

Furthermore, the dielectric layer 34 may have the first and second dielectric layers 34a, 34b with the differing dielectric constants, and the first transmission path 31 may be provided on the first dielectric layer 34a and the second transmission path 32 may be provided on the second dielectric layer 34b. By configuring in this manner, the capacity components of the impedances Z1, Z2 of the first and second transmission paths 31, 32 can be differentiated because the first and second transmission paths 31, 32 are provided in the dielectric layers 34a, 34b with mutually differing dielectric constants.

Alternatively, in one or more embodiments of the second example, the dielectric layer having the first and second dielectric layers with the differing dielectric constants, and the ground part on which the dielectric layer is provided, may be further provided. Moreover, the ground part may have the grounded conductor substrate, the first transmission path may be provided on the first dielectric layer, and the second transmission path may be provided on the second dielectric layer. Even by configuring in this manner, the capacity components of the impedances Z1, Z2 of the first and second transmission paths 31, 32 can be differentiated because the first and second transmission paths 31, 32 are provided on the dielectric layers 34a, 34b with the mutually differing dielectric constants.

Furthermore, in one or more embodiments of the second example, the ground part may further have the conductor substrate 33a and the electrically connected conductor layer 33b. Moreover, the conductor layer 33b may be provided in the dielectric layer 34 so as to overlap the second transmission path 32 in the plan view viewed from the normal direction of the main surface of the conductor substrate 33a. By configuring in this manner, the capacity components of the impedances Z1, Z2 of the first and second transmission paths 31, 32 can be differentiated by providing the conductor layer 33b on the dielectric layer 34 so as to overlap the second transmission path 32 in the plan view.

Furthermore, the conductor layer 33b electrically connected to the conductor substrate 33a may be provided on the dielectric layer 34, and the second transmission path 32 may be disposed inside the dielectric layer 34 and between the conductor substrate 33a and the conductor layer 33b. By configuring in this manner, the capacity components of the impedances Z1, Z2 of the first and second transmission paths 31, 32 can be differentiated because the second transmission path 32 disposed inside the dielectric layer 34 can form the two capacity components, in the gap between the conductor substrate 33a and in the gap between the conductor layer 33b.

Third Example

Next, embodiments of a third example will be described. In one or more embodiments of the third example, the amplitude of the first transmission signals S(+) transmitted over the first transmission path 31 and the amplitude of the second transmission signal S(−) transmitted over the second transmission path 32 are independently controlled. Items concerning the third example differing from the first and second examples will be described below. Moreover, identical reference codes will be attached to configurations identical or substantially identical to those in the first and second examples, and description thereof may be omitted.

Figure 8:
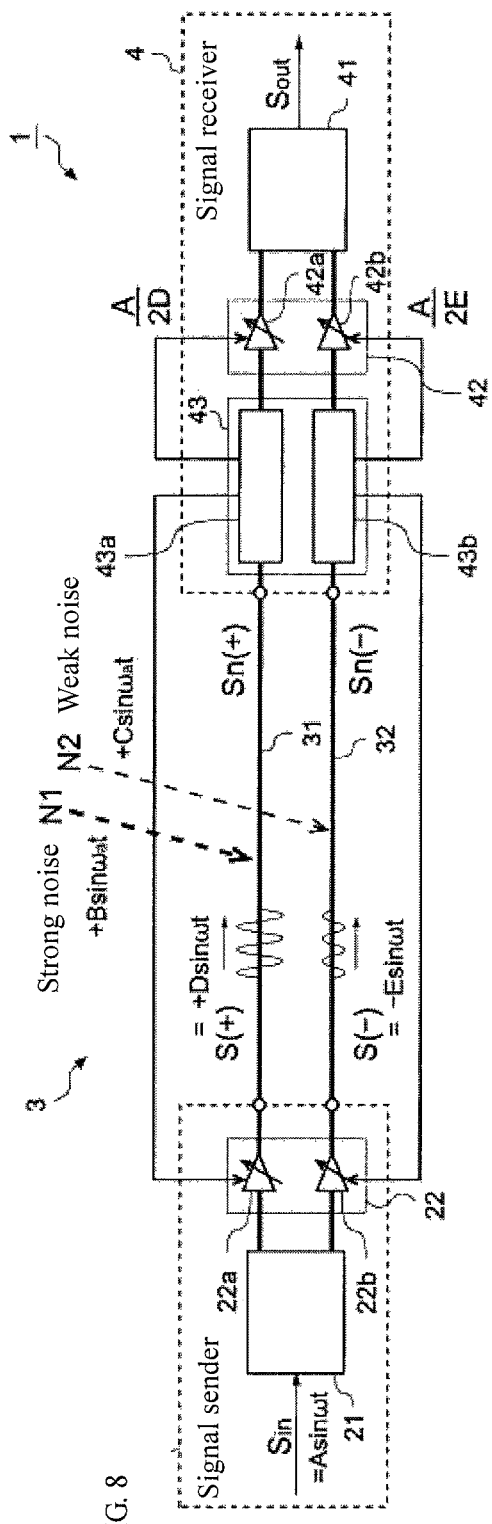
FIG. 8 is a conceptual block diagram illustrating a signal transmission device according to one or more embodiments of a third example of the present invention.

FIG. 8 is a conceptual block diagram illustrating a signal transmission device according to the third example. As illustrated in FIG. 8, the signal receiver 4 further includes a detector 43 that detects the amplitudes of the first and second transmission signals Sn(+), Sn(−) received by the signal receiver 4. This detector 43 is configured including first and second detectors 43a, 43b. The first and second detectors 43a, 43b are, respectively, first and second detectors that detect the amplitudes of the first and second transmission signals Sn(+), Sn(−) received by the signal receiver 4.

Furthermore, the sending signal amplitude adjuster 22 of the signal sender 2 has a function of adjusting each amplitude D, E of the first and second transmission signals S(+), S(−) so the amplitude of the first transmission signal S(+) differs from the amplitude of the second transmission signal S(−). Moreover, the sending signal amplitude adjuster 22 also has a function as a gain control amplifier/attenuator (GCA). The sending signal amplitude adjuster 22 feedback controls each amplitude D, E of the first and second transmission signals S(+), S(−) output from the signal sender 2 based on a detection result of the detector 43. For example, the first and second sending signal amplitude adjusters 22a, 22b respectively adjust each amplitude of the first and second transmission signals Sa(+), Sa(−) generated in the differential converter 21 to the amplitudes D, E that satisfy the conditions of formula 4 described above. Moreover, the first sending signal amplitude adjuster 22a feedback controls the amplitude D of the first transmission signal S(+) output from the signal sender 2 based on a detection result of the first detector 43a. Moreover, the second sending signal amplitude adjuster 22b feedback controls the amplitude E of the second transmission signal S(−) output from the signal sender 2 based on a detection result of the second detector 43b.

Furthermore, the reception signal amplitude adjuster 42 of the signal receiver 4 adjusts the amplitudes of the first and second transmission signals Sn(+), Sn(−) with each noise signal N1, N2 superimposed thereon based on the detection result of the detector 43. For example, the first reception signal amplitude adjuster 42a adjusts the amplitude of the first transmission signal Sn(+) superimposed with the first noise signal N1 to be multiplied by (A/2D) based on the detection result of the first detector 43a. Moreover, the second reception signal amplitude adjuster 42b adjusts the amplitude of the second transmission signal Sn(−) superimposed with the second noise signal N2 to be multiplied by (A/2E) based on the detection result of the second detector 43b.

In this manner, in one or more embodiments of the third example, the first and second transmission signals S(+), S(−) are independently AGC (automatic gain control) controlled based on the detection results of the first and second detectors 43a, 43b.

The single phase converter 41 converts first and second transmission signals (A/2D)Sn(+), (A/2E)Sn(−) adjusted in the reception signal amplitude adjuster 42 into the output signal Sout of the single phase by calculating as in formula 12 below.

$$Sout=(A/2D)Sn(+)-(A/2E)Sn(-) \quad \text{(Formula 12)}$$

Here, each amplitude of the differential signals (first and second transmission signals S(+), S(−)) is set so as to satisfy the conditions of formula 4 described above. Therefore, when the single phase converter 41 generates the output signal Sout of the single phase, the noise component is removed as in formula 13 below.

$$\begin{aligned} Sout &= \{+(A/2)\sin\omega t + (BA/2D)\sin\omega at\} - \\ &\quad \{-A/2)\sin\omega t + (CA/2E)\sin\omega at\} \\ &= A\sin\omega t + (A/2DE)(EB-CD)\sin\omega at \\ &= A\sin\omega t \end{aligned} \quad \text{(formula 13)}$$

Furthermore, the first and second noise signals N1, N2 of the identical phases superimposed on the first and second transmission signals Sn(+), Sn(−) are removed regardless of whether they have the identical amplitudes or the asymmetrical amplitudes (differing amplitudes). Therefore, in the signal transmission device 1, the influence the external noise exerts on the differential signals can be avoided.

In the above description, an example where the first and second transmission signals S(+), S(−) are independently AGC controlled is described, but the scope of application of the present invention is not limited to this example. One of either the first or the second transmission signals S(+), S(−) may be AGC controlled, and the other may be AGC balance controlled (control of a gain difference relative to one AGC control).

Embodiments of the third example of the present invention have been described above. According to one or more embodiments of the signal transmission device 1 of the third example, the signal receiver 4 further includes the detector 43 that detects the amplitudes of the first and second transmission signals Sn(+), Sn(−) received by the signal receiver 4. The sending signal amplitude adjuster 22 of the signal sender 2 adjusts each amplitude of the first and second transmission signals S(+), S(−) based on the detection result of the detector 43. The reception signal amplitude adjuster 42 of the signal receiver 4 independently adjusts each amplitude of the first and second transmission signals Sn(+), Sn(−) received by the signal receiver 4 based on the detection result of the detector 43.

By configuring in this manner, the amplitudes of the feedback controlled first and second transmission signals S(+), S(−) can be independently adjusted. Therefore, the influence that the noise signals N1, N2 with the differing amplitudes exert on the output signal Sout can be sufficiently reduced by differentiating the amplitudes of the first and second transmission signals S(+), S(−) transmitted over the transmission paths 3 even when the first and second transmission signals S(+), S(−) are feedback controlled.

Fourth Example

In one or more embodiments of the first to third examples described above, reducing the influence of the external noise is described, but the influence of the noise received from the outside and the influence of the noise imparted to the outside can be considered as being inseparable. Because of this, one or more embodiments of the first to third examples described above can be applied as a means of mitigating noise (for example, electromagnetic noise) radiated to the outside from the differential signals (first and second transmission signals) of the opposite phases that transmit the first and second transmission signals S(+), S(−).

Furthermore, FIG. 9 is a conceptual block diagram for describing how the electromagnetic noise radiated to the outside from the signal transmission device is mitigated. In FIG. 9, the amplitude E of the second transmission signal S(−) transmitted over the second transmission path 32 on a side near an external circuit A is set to be lower than the amplitude D of the first transmission signal S(+) transmitted over the first transmission path 31 on a far side thereof. By configuring in this manner, an amplitude difference of electromagnetic waves (that is, the noise) radiated to the external circuit from each transmission path 3 can be reduced or eliminated.

In FIG. 9, one or more embodiments of the signal transmission device 1 of the third example is described for illustration purposes, but needless to say, the electromagnetic noise radiated to the outside can be similarly mitigated even when using the signal transmission device 1 of the first example or the transmission paths 3 of the second example.

Embodiments of the present invention have been described above. Various modifications to the embodiments are possible in combining each component and each process, and it is understood by those skilled in the art that such modifications are within the scope of the present invention.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE CODES

1 Signal transmission device
2 Signal sender
21 Differential converter
22 Sending signal amplitude adjuster
3 Transmission path
31 First transmission path
32 Second transmission path
33 Reference path
33a Conductor substrate
33b Conductor layer
33c Via hole
34 Dielectric layer
4 Signal receiver
41 Single phase converter
42 Reception signal amplitude adjuster
43 Detector

What is claimed is:

1. A signal transmission device, comprising:
a signal sender that sends first and second transmission signals of mutually opposite phases;
a first transmission path over which the first transmission signal is transmitted;
a second transmission path over which the second transmission signal is transmitted; and
a signal receiver that converts the first transmission signal received from the first transmission path and the second transmission signal received from the second transmission path into an output signal of a single phase, wherein
the signal transmission device differentiates each amplitude of the first and second transmission signals sent from the signal sender, and
the signal receiver, based on an amplitude ratio of the first and second transmission signals, converts the received first and second transmission signals.

2. The signal transmission device according to claim 1, wherein
the signal sender comprises:
a differential converter that converts an input signal of a single phase into the first and second transmission signals of the opposite phases; and
a sending signal amplitude adjuster that adjusts each amplitude of the first and second transmission signals so the amplitude of the first transmission signal differs from the amplitude of the second transmission signal, and
the signal receiver comprises:
a reception signal amplitude adjuster that adjusts each amplitude of the first and second transmission signals received by the signal receiver based on the amplitude ratio of the first and second transmission signals adjusted by the sending signal amplitude adjuster; and
a single phase converter that converts the first and second transmission signals adjusted by the reception signal amplitude adjuster into the output signal of the single phase.

3. The signal transmission device according to claim 2, wherein
the signal receiver further comprises a detector that detects the amplitudes of the first and second transmission signals received by the signal receiver,
the sending signal amplitude adjuster of the signal sender independently adjusts each amplitude of the first and second transmission signals based on a detection result of the detector, and
the reception signal amplitude adjuster of the signal receiver independently adjusts each amplitude of the first and second transmission signals received in the signal receiver based on the detection result of the detector.

4. The signal transmission device according to claim 3, wherein an impedance of the first transmission path differs from an impedance of the second transmission path.

5. The signal transmission device according to claim 2, wherein an impedance of the first transmission path differs from an impedance of the second transmission path.

6. The signal transmission device according to claim 1, wherein an impedance of the first transmission path differs from an impedance of the second transmission path.

7. The signal transmission device according to claim 6, wherein cross-sectional areas of the first and second transmission paths differ.

8. The signal transmission device according to claim 7, further comprising:
a dielectric layer on which the first and second transmission paths are disposed; and
a ground part on which the dielectric layer is provided, wherein
the ground part comprises a grounded conductor substrate, and
a shortest distance between the first transmission path and the ground part differs from a shortest distance between the second transmission path and the ground part.

9. The signal transmission device according to claim 7, further comprising:

a dielectric layer comprising first and second dielectric layers with differing dielectric constants; and a ground part on which the dielectric layer is provided, wherein the ground part has a grounded conductor substrate, and the first transmission path is provided on the first dielectric layer and the second transmission path is provided on the second dielectric layer.

10. The signal transmission device according to claim 6, further comprising:

a dielectric layer on which the first and second transmission paths are disposed; and a ground part on which the dielectric layer is provided, wherein the ground part comprises a grounded conductor substrate, and a shortest distance between the first transmission path and the ground part differs from a shortest distance between the second transmission path and the ground part.

11. The signal transmission device according to claim 10, wherein the dielectric layer comprises first and second dielectric layers with differing dielectric constants, and the first transmission path is provided on the first dielectric layer and the second transmission path is provided on the second dielectric layer.

12. The signal transmission device according to claim 11, wherein the ground part further comprises a conductor layer electrically connected to the conductor substrate, and the conductor layer is provided on the dielectric layer so as to overlap the second transmission path in a plan view viewed from a normal direction of a main surface of the conductor substrate.

13. The signal transmission device according to claim 10, wherein the ground part further comprises a conductor layer electrically connected to the conductor substrate, and the conductor layer is provided on the dielectric layer so as to overlap the second transmission path in a plan view viewed from a normal direction of a main surface of the conductor substrate.

14. The signal transmission device according to claim 13, wherein the conductor layer electrically connected to the conductor substrate is provided on the dielectric layer, and the second transmission path is disposed inside the dielectric layer and between the conductor substrate and the conductor layer.

15. The signal transmission device according to claim 6, further comprising:

a dielectric layer comprising first and second dielectric layers with differing dielectric constants; and a ground part on which the dielectric layer is provided, wherein the ground part has a grounded conductor substrate, and the first transmission path is provided on the first dielectric layer and the second transmission path is provided on the second dielectric layer.

16. The signal transmission device according to claim 15, wherein the ground part further comprises a conductor layer electrically connected to the conductor substrate, and the conductor layer is provided on the dielectric layer so as to overlap the second transmission path in a plan view viewed from a normal direction of a main surface of the conductor substrate.

17. The signal transmission device according to claim 1, wherein the signal transmission device sets an amplitude ratio relative to a first noise signal of the first transmission signal before the first noise signal is superimposed thereon to be equivalent to an amplitude ratio relative to a second noise signal of the second transmission signal before the second noise signal is superimposed thereon.

18. A signal transmission method, comprising:

sending first and second transmission signals of mutually opposite phases;

transmitting the first and second transmission signals; and converting the transmitted first and second transmission signals into an output signal of a single phase, wherein at least one of either the sending or the transmitting comprises differentiating each amplitude of the transmitted first and second transmission signals, and the first and second transmission signals are converted based on an amplitude ratio of the first and second transmission signals adjusted in the differentiating.

19. The signal transmission method according to claim 18, further comprising:

converting an input signal of a single phase into the first and second transmission signals of the opposite phases;

adjusting each amplitude of the first and second transmission signals so the amplitude of the first transmission signal differs from the amplitude of the second transmission signal;

adjusting each amplitude of the first and second transmission signals based on the amplitude ratio of the adjusted first and second transmission signals; and converting the adjusted first and second transmission signals into the output signal of the single phase.

20. The signal transmission method according to claim 19, further comprising:

detecting the amplitudes of the first and second transmission signals received by the signal receiver, independently adjusting each amplitude of the first and second transmission signals based on the detection; and adjusting each amplitude of the first and second transmission signals received in the signal receiver based on the detection.

* * * * *